(12) United States Patent
Feustel et al.

(10) Patent No.: US 6,344,973 B1
(45) Date of Patent: *Feb. 5, 2002

(54) POWER MODULE WITH A CIRCUIT ARRANGEMENT COMPRISING ACTIVE SEMICONDUCTOR COMPONENTS AND PASSIVE COMPONENTS, AND METHOD FOR PRODUCING SAME

(75) Inventors: Hans-Peter Feustel, Roth; Friedrich Loskarn, Hirschaid; Reinhard Rückert, Zindorf, all of (DE)

(73) Assignee: Alcatel, Paris (FR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/341,527
(22) PCT Filed: Jan. 14, 1998
(86) PCT No.: PCT/EP98/00655
§ 371 Date: Aug. 30, 1999
§ 102(e) Date: Aug. 30, 1999
(87) PCT Pub. No.: WO98/32213
PCT Pub. Date: Jul. 23, 1998

(30) Foreign Application Priority Data
Jan. 14, 1997 (DE) .......................... 197 00 963

(51) Int. Cl.[7] .............................................. H05K 1/18
(52) U.S. Cl. .................. 361/760; 361/765; 361/793; 361/807; 361/738; 361/763–766; 174/255; 174/256; 174/257; 174/260; 338/307; 338/308; 338/309
(58) Field of Search ................................. 361/760, 765, 361/736, 793, 807, 738, 763–766; 174/255–257, 260; 338/307, 309, 314

(56) References Cited

U.S. PATENT DOCUMENTS

| | | | | | |
|---|---|---|---|---|---|
| 4,658,332 A | * | 4/1987 | Baker et al. | ................ | 361/751 |
| 4,788,524 A | * | 11/1988 | Ozaki | .......................... | 338/309 |
| 5,119,272 A | * | 6/1992 | Ohyama et al. | ............ | 361/765 |
| 5,276,423 A | * | 1/1994 | Breit et al. | .................. | 338/308 |
| 5,291,375 A | * | 3/1994 | Mukai | ......................... | 361/760 |
| 5,621,240 A | * | 4/1997 | Ellis | ............................. | 257/536 |
| 5,621,701 A | * | 4/1997 | Linden et al. | .............. | 361/720 |
| 5,818,699 A | * | 10/1998 | Fukuoka | ..................... | 361/760 |
| 5,855,995 A | * | 1/1999 | Haq et al. | ................... | 428/210 |
| 5,872,403 A | * | 2/1999 | Bowman et al. | ............ | 257/780 |
| 6,201,696 B1 | * | 3/2001 | Shimizu et al. | ............. | 361/704 |

FOREIGN PATENT DOCUMENTS

EP 0 415 571 A2 * 2/1990 ............ H01C/7/00

* cited by examiner

*Primary Examiner*—Leo P. Picard
*Assistant Examiner*—David Foster
(74) *Attorney, Agent, or Firm*—Sughrue Mion, PLLC

(57) ABSTRACT

The invention relates to a power module with a circuit arrangement provided with active semiconductor components and passive components and with a circuit substrate, whereby at least a portion of the active semiconductor components are soldered onto a DCB substrate and at least a portion of the passive components are printed in thick film technology on at least one ceramic substrate. The upper side of the DCB substrate is structured to form track conductors and connecting surfaces for receiving the active semiconductor components and passive components of the circuit arrangement. On the ceramic substrate, for each passive component, a first print layer is printed in thick film technology and at least one contact surface as additional print layer laterally adjoining the first print layer. The ceramic substrates for the passive components in thick film technology are connected via the at least one contact surface with the corresponding connecting surface(s) of the DCB substrate by means of a soldered connection.

14 Claims, 1 Drawing Sheet

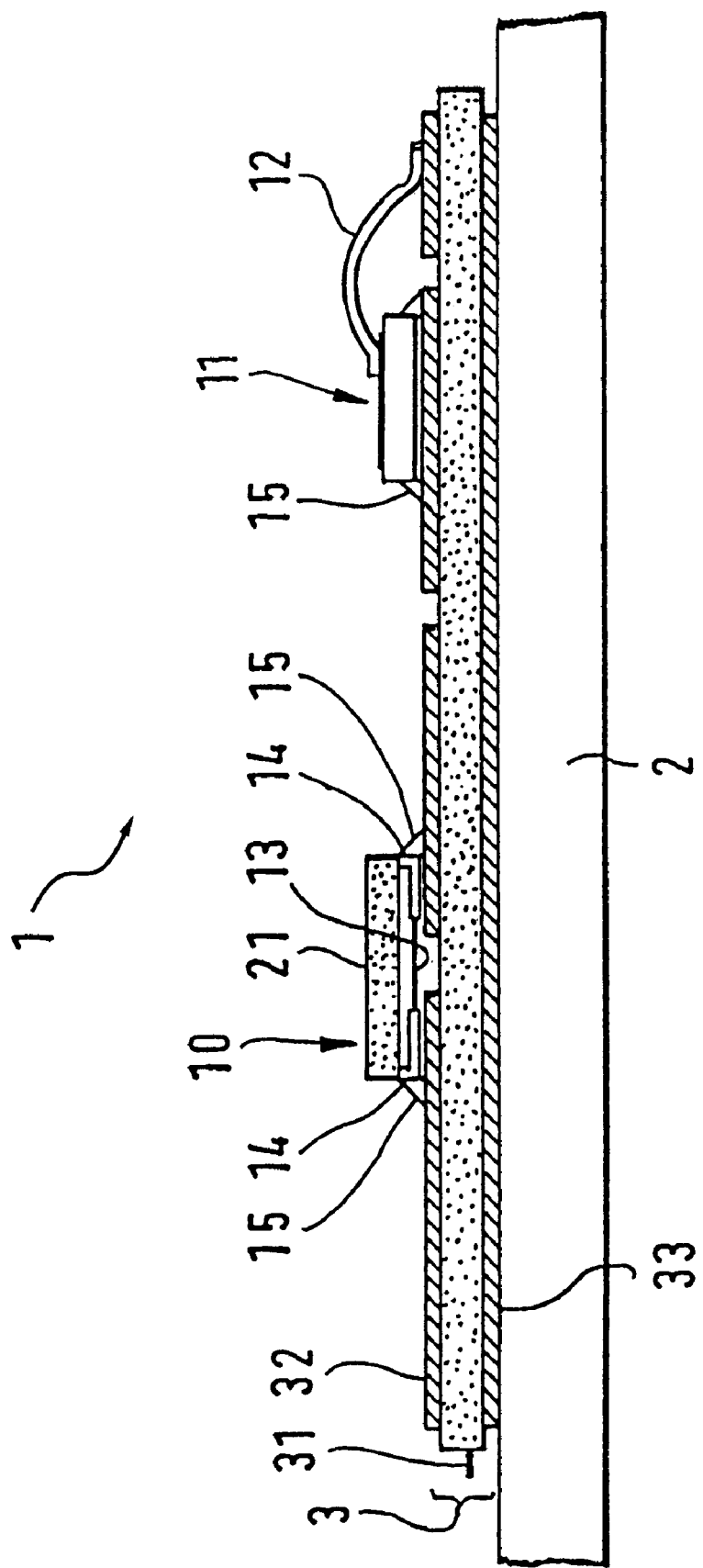

POWER MODULE WITH A CIRCUIT ARRANGEMENT COMPRISING ACTIVE SEMICONDUCTOR COMPONENTS AND PASSIVE COMPONENTS, AND METHOD FOR PRODUCING SAME

BACKGROUND OF THE INVENTION

Power modules are used in many application fields for various tasks, for example, to control the speed and power of electric motors. A circuit arrangement acting as power unit forms part of such power modules and typically has both active semiconductor components, such as power semiconductor components, and passive components, such as resistors (e.g., shunts for current measurement) and possibly capacitors. The power semiconductor components work in switched mode, which causes high rates of current change. These high rates of current change necessitate a low-inductance structure of the circuit arrangement to prevent overvoltages.

Consequently, and for reasons of adequate heat removal of their power dissipation, the carrier element used for the circuit arrangement's active semiconductor components (particularly the power semiconductor components) is typically a so-called DCB (direct copper bonding) substrate, which is made of a ceramic layer enclosed by two copper layers (e.g., made of aluminum oxide $Al_2O_3$). The active semiconductor components (power semiconductor components) are soldered to the upper copper layer of the DCB substrate and contacted by means of bond wires. The upper copper layer of the DCB substrate is structured (interrupted) to form track conductors for connecting the power semiconductor components.

For mechanical stabilization and heat removal, the DCB substrate is mounted on a metal plate serving as circuit substrate, typically soldered. This metal plate transfers the heat loss to a cooling system.

The circuit arrangement's passive components (particularly the resistors) are advantageously realized in thick film technology (i.e., printed on a ceramic substrate). This ceramic substrate, in a separate manufacturing step, is bonded to the circuit substrate adjacent to the DCB substrate (e.g., by means of heat conductive bonding).

The inherent disadvantage is that separate process steps and technologies are required for soldering the DCB substrate and bonding the ceramic substrate to the circuit substrate, which is time-consuming and costly;

Connection (contacting) between the circuit arrangement's passive components mounted on the ceramic substrates and the active semiconductor components mounted on the DCB substrates is problematic due to the spatial separation. This requires long connecting leads and connecting lugs, which as parasitic inductances have a negative effect on the properties of the circuit arrangement or power module (generation of overvoltages, EMV problems).

DE 35 38 933 A1 furthermore shows a power module in which the ceramic substrate carrying the passive components is soldered directly to the DCB substrate carrying the active semiconductor components. Here, the solder connection performs a pure fixation and heat conducting function. Although this eliminates the additional process step of bonding, a large number of bond wires continue to be required for electric contacting of the passive components with the track conductor structure arranged on the DCB substrate. Bond wires, however are costly and susceptible to mechanical stresses.

SUMMARY OF THE INVENTION

The object of the invention is to define a power module in accordance with the preamble of claim 1 with a simple structure and manufacturing process, in which these disadvantages are obviated.

According to the invention, this object is attained by the features of claim 1.

Advantageous further developments of the power module and a process for its manufacture are the subject of the additional claims.

In the inventive power module, at least a portion of the passive components is realized by means of thick film technology (e.g., by depositing on a ceramic substrate a first print layer as the actual component and at least one additional print layer laterally adjacent to the first print layer acting as contact surface). The ceramic substrate thus printed (the thick film circuit) is placed on the upper side of the DCB substrate (the upper copper layer) suitably structured to form track conductors and connecting surfaces and is connected with the DCB substrate by soldering the contact surface(s) to the corresponding connecting surfaces of the DCB substrate. Connection (contacting) with the other semiconductor components arranged on the DCB substrate can be suitably effected either directly via track conductors or via bond wires. The DCB substrate is suitably connected with the circuit substrate of the circuit arrangement, e.g., soldered to this circuit substrate (e.g., a metal plate). Power dissipation of the passive components (particularly resistors) arranged on the ceramic substrate is removed via the ceramic substrate and the DCB substrate to the circuit substrate. During production, the ceramic substrates with the passive components (the resistors) can be soldered to the circuit substrate simultaneously to soldering the active semiconductor components and/or simultaneously to soldering the DCB substrate to the circuit substrate so that no separate process step is required. In other words, soldering the thick film circuit (passive components on ceramic substrate) can be executed simultaneously with soldering the active semiconductor components to the DCB substrate or simultaneously with soldering the active semiconductor components to the DCB substrate and the DCB substrate to the circuit substrate.

In addition to the components realized in thick film technology, other components (e.g., SMD components) can be mounted on the ceramic substrate and connected with the rest of the circuit arrangement by means of contact surfaces.

The advantages of said for manufacturing a power module are that production complexity and thus cost of the power module are reduced by the simultaneously performed soldering process required for the passive components (the resistors) onto the active semiconductor components;

a simpler and more compact structure results due to the low number of connecting leads of the circuit arrangement and the reduced lead length of the possibly still present connecting leads;

overvoltages, and thus impairment of the functioning of the power module, are prevented due to the shorter lengths of the connecting leads and the reduced parasitic inductances.

BRIEF DESCRIPTION OF THE DRAWING

Below, the inventive power module is described by means of an exemplary embodiment in conjunction with the drawing. The FIGURE shows a schematic view of the structure of the power module in a sectional drawing.

DETAILED DESCRIPTION OF THE INVENTION

The power module's circuit arrangement 1 disposed, for example, on a circuit substrate 2 with the dimensions 99 mm×57 mm×3 mm comprises, for example, a plurality of power semiconductor components 11 (power transistors and power diodes) and a plurality of resistors 10 as shunts for measuring the transistor currents.

The carrier element provided for the power semiconductor components 11, which are implemented as semiconductor devices, and the resistors 10, which are realized in thick film technology, is a DCB substrate 3, which is composed of a first copper layer 32 (structured to form track conductors and connecting surfaces), a ceramic layer 31 formed as an oxide layer, and a second (unstructured) copper layer 33. The power semiconductor components 11, e.g., the power transistors and power diodes formed as semiconductor devices (semiconductor chips), are soldered to the connecting surfaces of the first copper layer 32 (i.e., to the upper side of the DCB substrate 3) by means of solder 15 and are mechanically connected by this soldering process with the DCB substrate 3 (of the first copper layer 32) (particularly for removal of their power dissipation) and are electrically conducted via bond wires 12. The resistors 10 from the resistor track 13, the two contact surfaces 14 laterally adjoining the resistor track 13 (metallizations), and a protective layer (passivation) (not depicted) are printed on a ceramic substrate 21. This ceramic substrate 21, using contact surfaces 14, is soldered to the connecting surfaces provided for this purpose on the upper side of DCB substrate 3 (first copper layer 32) (by means of solder 15). In production, this soldering process is preferably carried out simultaneously to soldering the power semiconductor components 11 onto DCB substrate 3 and DCB substrate 3 with the mounted active semiconductor components 11 and passive components 10 is subsequently soldered to circuit substrate 2, which is formed, for example, by a metallic copper plate.

What is claimed is:

1. A power module with a circuit arrangement provided with active semiconductor components and passive components and with a circuit substrate, wherein at least a portion of the active semiconductor components are soldered to a DCB substrate and at least a portion of the passive components are printed in thick film technology on at least one ceramic substrate, wherein
   for each passive component provided, on a print side of the at least one ceramic substrate, a first print layer determining the properties of the passive component is printed in thick film technology and at least one contact surface is provided as an additional print layer laterally adjoining the first print layer; and
   the at least one ceramic substrate is electrically connected via the at least one contact surface with the corresponding contact surface(s) of the DCB substrate by a soldered connection.

2. A power module according to claim 1 wherein additional components are mounted on the ceramic substrate.

3. The power module of claim 1, wherein said soldering of said at least one ceramic substrate is at least one of simultaneous with soldering the active semiconductor components to the DCB substrate and simultaneous with soldering the DCB substrate onto the circuit substrate.

4. The power module of claim 1, wherein said passive component comprises a resistor and said active component comprises one of a power transistor and a power diode.

5. The power module of claim 1, wherein said circuit substrate is formed by a metallic copper plate.

6. The power module of claim 1, wherein said active component and said passive component comprise shunts that measure the transistor currents.

7. The power module of claim 1, wherein an upper side of the DCB substrate is structured to form track conductors and connective surfaces that receive the active semiconductor components and the passive components of the circuit arrangement.

8. A process for manufacturing a power module with a circuit arrangement provided with active semiconductor components and passive components and with a circuit substrate, wherein at least a portion of the active semiconductor components are soldered to a DCB substrate and at least a portion of the passive components are printed in thick film technology on at least one ceramic substrate and wherein an upper side of the DCB substrate is structured to form track conductors and connecting surfaces for receiving the active semiconductor components and the passive components of the circuit arrangement, said process further comprising the steps of:
   for each passive component provided, on a print side of the at least one ceramic substrate, printing a first print layer to determine the properties of the passive component in thick film technology and at least one contact surface as additional print layer laterally adjoining the first print layer; and
   electrically connecting the at least one ceramic substrate via the at least one contact surface with the corresponding contact surface(s) of the DCB substrate by soldering.

9. A process according to claim 8, wherein said soldering of the ceramic substrate is carried out at least one of simultaneously with soldering the active semiconductor components to the DCB substrate and simultaneously with soldering the DCB substrate onto the circuit substrate.

10. A process according to claim 8, further comprising mounting additional components on the ceramic substrate.

11. The method of claim 8, further comprising forming said circuit substrate by a metallic copper plate.

12. A power module circuit, comprising:
   a first substrate comprising a first ceramic layer sandwiched between a first conductive layer and a second conductive layer;
   a first portion of an active component electrically connected to a first surface of said first conductive layer;
   a second substrate electrically connected to a first surface of said second conductive layer; and
   a first portion of a passive component electrically connected to said first surface of said first conductive layer, and a second portion of said passive component printed via thick film technology on a passive component substrate that is electrically connected to said first conductive layer by a contact surface adjacent to a first print layer positioned on said second surface of said passive component.

13. The circuit of claim 12, wherein said first conductive layer and said second conductive layer are made of copper, said passive component comprises a resistor and said active component comprises one of a transistor and a diode, said electrical connections are established by at least one of soldering and bond wires, and a first surface of said DCB substrate forms track conductors and conductive surfaces that receive said active component and said passive component.

14. The circuit of claim 12, wherein said passive component comprises a resistor and said active component comprises one of a transistor and a power diode.

* * * * *